(12) United States Patent  
Suhara

(10) Patent No.: US 6,527,322 B2
(45) Date of Patent: Mar. 4, 2003

(54) ELECTRIC-COMPONENT HOLDING HEAD

(75) Inventor: Shinsuke Suhara, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/832,797

(22) Filed: Apr. 12, 2001

(65) Prior Publication Data

US 2001/0035659 A1 Nov. 1, 2001

(30) Foreign Application Priority Data

May 1, 2000 (JP) ........................................ 2000-132576

(51) Int. Cl.$^7$ ........................... B25J 15/06; H05K 13/04
(52) U.S. Cl. ........................... 294/64.1; 29/743; 901/40
(58) Field of Search ........................... 294/64.1, 64.2, 294/64.3; 901/40; 414/752.1, 627, 737; 29/743

(56) References Cited

U.S. PATENT DOCUMENTS

| | | | | |
|---|---|---|---|---|
| 4,042,999 A | * | 8/1977 | Triantafyllou | 15/323 |
| 4,825,502 A | * | 5/1989 | Armstrong et al. | 15/339 |
| 4,905,370 A | * | 3/1990 | Hineno et al. | 29/740 |
| 5,033,783 A | * | 7/1991 | Izumi et al. | 29/743 |
| 5,566,718 A | * | 10/1996 | Nagai et al. | 137/560 |
| 5,593,470 A | * | 1/1997 | Shagott et al. | 15/347 |
| 6,043,458 A | * | 3/2000 | Fortune | 219/228 |

FOREIGN PATENT DOCUMENTS

| | | |
|---|---|---|
| JP | 6-342998 | 12/1994 |
| JP | 07-302999 | 11/1995 |
| JP | 10-126097 | 5/1998 |
| JP | 10-242694 | 9/1998 |
| JP | 11-330789 | 11/1999 |
| JP | 11-330792 | 11/1999 |

* cited by examiner

Primary Examiner—Dean J. Kramer
(74) Attorney, Agent, or Firm—Oliff & Berridge, PLC

(57) ABSTRACT

An electric-component holding head, including a holder member including a nozzle-hold portion which holds a suction nozzle, and having a negative-pressure passage through which a negative pressure is supplied to the suction nozzle so that the suction nozzle holds an electric component by applying the negative pressure thereto, a filter which is provided in the negative-pressure passage and removes foreign matters present in an air passing through the filter, the holder member having an outer surface and a filter-insert hole which has an opening in the outer surface and communicates between the outer surface and the negative-pressure passage so that the filter is inserted from outside the holder member via the filter-insert hole into the negative-pressure passage, and a closure member which closes the opening of the filter-insert hole.

24 Claims, 10 Drawing Sheets

ELECTRIC-COMPONENT HOLDING HEAD

BACKGROUND OF THE INVENTION

1. Field of the Invention

The present invention relates to an electric-component holding head which sucks and holds an electric component by applying negative pressure thereto, and particularly to a filter which is provided in a negative-pressure passage of the head and removes foreign matters present in air supplied through the passage.

2. Discussion of Related Art

There is known an electric-component holding head including a holder member which holds a suction nozzle for sucking and holding an electric component and which is provided by a plurality of members such that the holder member can be disassembled into those members. A filter is provided in a negative-pressure passage which is defined by the plurality of members. The filter removes foreign matters present in the air which passes through the filter when the suction nozzle sucks the electric component. When the filter becomes dirty, it is replaced with a new one, or is cleaned. To this end, the holder member is disassembled into the plurality of members, so that the dirty filter is replaced with a new one, or is cleaned. Then, the plurality of members are assembled again into the holder member, such that the new filter or the cleaned filter is accommodated in the holder member.

However, it is cumbersome to disassemble and re-assemble the holder member each time the filter is replaced with a new one or is cleaned. In addition, a person cannot see, from outside the holding head, to what degree the filter is dirty. For example, in the case where the filter is replaced with a new one at a predetermined period, the filter which is not so dirty and can be used further may be replaced with a new one, which leads to lowering the running cost of the holding head, or the filter which is so dirty and cannot be used any more may be used further uselessly. That is, it is difficult to determine a timing when the filter is replaced with a new one or is cleaned.

SUMMARY OF THE INVENTION

The present invention provides an electric-component holding head which has each of the following features. Those features are described, like claims, in respective paragraphs, and those paragraphs are given respective numbers. Any feature that includes another feature shall do so by referring to the number given to the latter feature. However, the following features and the appropriate combinations thereof are just examples to which the technical features, and the combinations thereof, described in the specification are by no means limited. In addition, in the case where one feature recites a plurality of items, it is not essentially required that all of those items be simultaneously employed. That is, it is possible to select and employ only a portion (one, two, . . . , but not all) of those items.

(1) According to a first feature of the present invention, there is provided an electric-component holding head, comprising a holder member including a nozzle-hold portion which holds a suction nozzle, and having a negative-pressure passage through which a negative pressure is supplied to the suction nozzle so that the suction nozzle holds an electric component by applying the negative pressure thereto; a filter which is provided in the negative-pressure passage and removes foreign matters present in an air passing through the filter; the holder member having an outer surface and a filter-insert hole which has an opening in the outer surface and communicates between the outer surface and the negative-pressure passage so that the filter is inserted from outside the holder member via the filter-insert hole into the negative-pressure passage; and a closure member which closes the opening of the filter-insert hole.

The closure member may be attached to the holder member in such a manner that the closure member is pivotable relative to the holder member and accordingly is opened and closed by being pivoted or rotated by an operator, or in a different manner that the closure member is detachable from the holder member. It is preferred that the filter and the closure member be connected to each other as recited in the following feature (2), but it is not essentially required. For example, it is possible to draw out the filter after the closure member is detached or opened.

The nozzle-hold portion may be one which holds a single suction nozzle, or one which holds a plurality of suction nozzles.

Before the filter is removed from the filter-insert hole, the closure member is operated to open the opening of the hole. After the filter is removed through the filter-insert hole, the old filter is replaced with a new one, or is cleaned. After the new or cleaned filter is inserted in the filter-insert hole, the closure member is operated to close the opening of the hole. Thus, the replacing or cleaning of the filter can be done outside the holder member. Therefore, even if the holder member may be one which is obtained by assembling a plurality of constituent members, an operator can easily replace or clean the filter, without needing to disassemble those constituent members. In addition, the holder member may be one which cannot be disassembled, because the replacing or cleaning of the filter can be done outside the holder member. Thus, the present electric-component holding head can employ the holder member which cannot be disassembled and which has the negative-pressure passage in which the filter is provided to remove foreign matters included in the air passing through the passage.

(2) According to a second feature of the present invention that includes the first feature (1), the closure member includes a closure portion which closes the opening of the filter-insert hole, and a filter-hold portion which holds the filter.

The present holding head assures that the attaching of the filter to the holder member and the closing of the opening of the filter-insert hole with the closure member are simultaneously done, and that the detaching of the filter from the holder member and the opening of the filter-insert hole with the closure member are simultaneously done. Thus, the replacing or cleaning of the filter can be easily carried out.

(3) According to a third feature of the present invention that includes the first or second feature (1) or (2), the holder member further includes a first engaging portion, the closure member includes a second engaging portion which engages the first engaging portion of the holder member and thereby fixes the closure member to the holder member, and the head further comprises an elastic member which provides an elastic force with which the first and second engaging portions are kept in engagement with each other.

For example, the second engaging portion of the closure member may be provided by an engaging member which is attached to the closure member such that the engaging member is pivotable relative to the closure member. In this case, the elastic member may be provided by a spring member which biases the engaging member in a direction to keep the engagement of the first engaging portion and the engaging member. According to the sixth feature (6), described later, the easily deformable portions function as not only an attaching device which attaches the second engaging portion to the base portion of the closure member such that the second engaging portion is pivotable, but also as the elastic member.

Since the engagement of the first and second engaging portions is kept with the elastic force, the closure member is prevented from falling off the holder member, while continuing to close the opening of the filter-insert hole.

(4) According to a fourth feature of the present invention that includes the third feature (3), the second engaging portion of the closure member comprises a pair of arms which extend toward the holder member and have respective engaging claws at respective free end portions thereof.

(5) According to a fifth feature of the present invention that includes the fourth feature (4), the closure member further includes at least one operable portion which is operable to move at least one of the pair of arms away from the other of the arms.

It is desirable in view of the ease of operation that the operable portion be provided by the operable levers recited in the following feature (6), but it is not essentially required. For example, the operable portion may be provided by respective portions of the respective free end portions of the two arms that are opposite to the respective engaging claws and are operable with two fingers of an operator to move the two free end portions away from each other. When the filter is detached from the holder member, the operator operates, with his or her fingers, the two operable portions to elastically deform the two arms and thereby disengage the two engaging claws from the first engaging portion. In this case, the arms also function as the elastic member.

(6) According to a sixth feature of the present invention that includes the fifth feature (5), the closure member includes, as the at least one operable portion, a pair of operable levers which extend in a direction opposite to a direction in which the pair of arms extend toward the holder member, and further includes a pair of connection portions each of which connects between a corresponding one of the pair of arms and a corresponding one of the pair of operable levers; a base portion; a pair of easily deformable portions each of which is provided between a corresponding one of the pair of connection portions and the base portion and is more easily elastically deformable than the one connection portion and the base portion, and when the pair of levers are operated such that respective free end portions thereof are moved toward each other, respective free end portions of the pair of arms are moved away from each other because of elastic deformation of the pair of easily deformable portions, so that the respective engaging claws of the pair of arms are disengaged from the first engaging portion.

The respective free end portions of the two arms can be easily moved away from each other, by operation of the two operable levers with a small operating force of an operator. Thus, the filter can be easily detached from the holder member. In this holding head, the easily deformable portions function as not only hinges which connect the arms and the operable levers to the base portion of the closure member such that the arms and the levers are pivotable relative to the base portion, but also as the elastic member which keeps the engagement of the first and second engaging portions.

(7) According to a seventh feature of the present invention that includes any one of the second to sixth features (2) to (6), the filter-hold portion of the closure member includes a shank portion which extends perpendicularly from the closure portion, and a head portion which is formed at a free end of the shank portion, and the shank portion extends through the filter and the head portion prevents the filter from falling off the shank portion.

The filter may be permanently fixed to the filter-hold portion, or may be detachably attached to the same. In the former case, when the filter is replaced with a new one, the closure member is also replaced with a new one; and when the filter is cleaned, the closure member may also be cleaned. In the latter case, only the filter may be replaced with a new one, or be cleaned.

(8) According to an eighth feature of the present invention that includes the first feature (1), the holding head further comprises an attaching device which attaches the closure member to the holder member such that the closure member is pivotable relative to the holder member; and a closure-state keeping device which keeps a state in which the closure member closes the opening of the filter-insert hole.

When the filter is replaced with a new one, or is cleaned, the closure member is pivoted in a state in which the closure-state keeping device is not operated to keep the closure state. After the filter is replaced or cleaned, the closure member is operated to close the opening of the filter-insert hole and the closure-state keeping device is operated to keep the closure state.

(9) According to a ninth feature of the present invention that includes the eighth feature (8), the holding head further comprises a filter-hold member which is separate from the closure member and holds the filter.

The eighth feature (8) allows such a manner that the filter-hold member and the closure member are integrally formed with each other according to the second feature (2). In this case, when the closure member is pivoted, the filter is inserted into, or drawn out of, the filter-insert hole. The attaching device may be one which allows the closure member to be detached from the holder member when the filter is replaced with a new one or is cleaned. Otherwise, the filter may be one which is detachable from the filter-hold portion. However, in many cases, it is more convenient to employ the filter-hold member which is separate from the closure member according to this feature.

When the filter is replaced or cleaned, the closure member is pivoted to open the opening of the filter-insert hole and take out the filter with the filter-hold member. The filter may be permanently fixed to the filter-hold member, or may be detachably attached to the same. When the filter is replaced with a new one, the filter-hold member may, or may not, be replaced with a new one. After the filter is replaced or cleaned, the filter held by the filter-hold member is inserted into the filter-insert hole and the closure member is operated to close the opening of the filter-insert hole.

(10) According to a tenth feature of the present invention that includes the eighth or ninth feature (8) or (9), the closure-state keeping device includes a first engaging portion which is provided by a free end portion of the closure member, and a second engaging portion which is provided by a portion of the holder member and engages the first engaging portion.

(11) According to an eleventh feature of the present invention that includes any one of the first to tenth features (1) to (10), the closure member is formed of a substantially transparent material so that in a state in which the closure member closes the opening of the filter-insert hole, the filter is visible from outside the holder member through the closure member.

The transparency of the material used to form the closure member may be at a degree which assures that the closure member enables an operator to see and judge whether the filter is dirty or not, or to what degree the filter is dirty. Thus, the material may be substantially transparent. In addition, it is preferred that the material be colorless and transparent. However, the material may be colored and transparent.

The closure member is entirely formed of the transparent material, starting with an inner surface thereof facing the filter-insert hole and ending with an outer surface thereof opposite to the inner surface, so that an operator can externally see the filter through the closure member. Thus, the operator can replace the filter with a new one, or clean the filter, if he or she sees the filter from outside the holder member and finds that the filter is so dirty as to be replaced with a new one or be cleaned. In this case, the operator can replace or clean the filter at an appropriate timing that is not too early or too late. If the timing when the degree of dirtiness of the filter is inspected by the operator after the commencement of use of the filter is pre-set at a time which is somewhat earlier than expected, he or she can surely find a dirty filter without delay of time. If the operator sees the filter and finds that the filter is not so dirty as to be replaced or cleaned, he or she can postpone the timing of inspection of the filter, without replacing or cleaning the filter. Thus, the filter can be replaced or cleaned at high cost performance. In addition, since the dirty filter is replaced or cleaned at the earliest possible timing and is no longer used, the foreign matters included in the negative-pressure air supplied through the negative-pressure passage are effectively removed by the filter.

(12) According to a twelfth feature of the present invention, there is provide an electric-component holding head, comprising a holder member including a nozzle-hold portion which holds a suction nozzle, and having a negative-pressure passage through which a negative pressure is supplied to the suction nozzle so that the suction nozzle holds an electric component by applying the negative pressure thereto; a filter which is provided in the negative-pressure passage and removes foreign matters present in an air passing through the filter; and at least a portion of the holder member is formed of a substantially transparent material so that the filter is visible from outside the holder member.

The transparency of the material used to form the portion of the holder member may be at a degree which assures that the portion of the holder member enables an operator to see and judge whether the filter is dirty or not, or to what degree the filter is dirty. Thus, the material may be substantially transparent. In addition, it is preferred that the material be colorless and transparent. However, the material may be colored and transparent.

The above-indicated eleventh feature (11) is one embodiment according to this feature (12). However, the present feature (12) may otherwise be embodied. For example, an electric-component holding head which does not employ a closure member may employ a holder member at least a portion of which is formed of a substantially transparent material. In the latter case, if a portion of the holder member that surrounds the filter is substantially entirely formed of the transparent material, an operator can easily inspect whether the filter is dirty. Otherwise, it is possible to form a through-hole in a portion of a wall surrounding the filter and permanently fill the through-hole with a substantially transparent material.

BRIEF DESCRIPTION OF THE DRAWINGS

The above and optional objects, features, and advantages of the present invention will be better understood by reading the following detailed description of preferred embodiments of the invention when considered in conjunction with the accompanying drawings, in which.

DETAILED DESCRIPTION OF PREFERRED EMBODIMENTS

Hereinafter, there will be described in detail an electric-component mounting apparatus including an electric-component holding head, to which the present invention is applied, by reference to the drawings.

Figure 1:
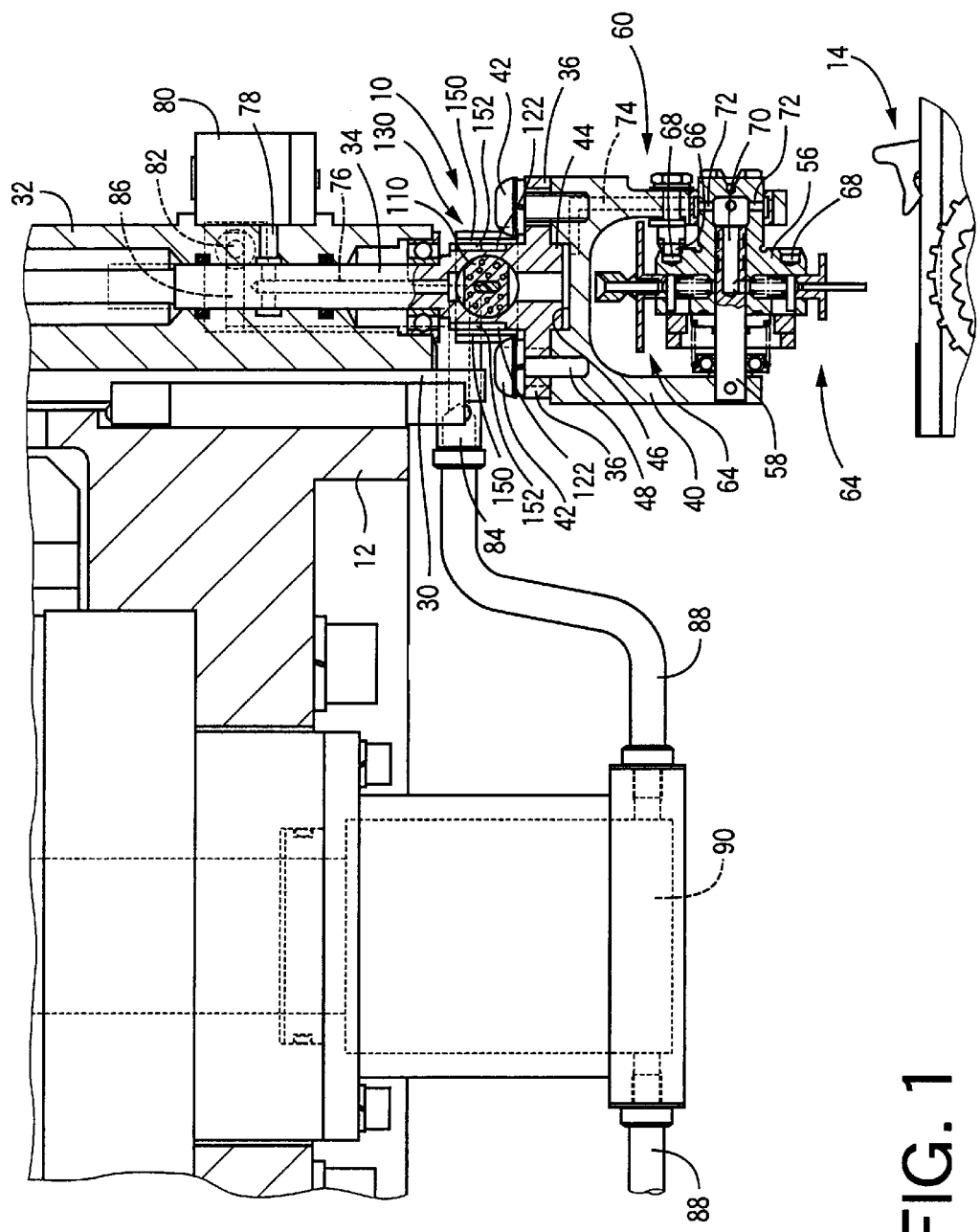
FIG. 1 is a cross-sectioned, rear elevation view of an electric-component holding head of an electric-component mounting apparatus to which the present invention is applied.

As shown in FIG. 1, the present electric-component mounting apparatus includes a plurality of electric-component holding heads 10 (only one holding head 10 is shown in FIG. 1). Those holding heads 10 are provided on a rotary table 12, such that the heads 10 are equiangularly spaced from each other about an axis line, e.g., a vertical axis line. The rotary table 12 is supported by a frame, not shown, such that the table 12 is rotatable about the vertical axis line. As the rotary table 12 is intermittently rotated by a table driving or rotating device, not shown, each of the holding heads 10 is sequentially moved to, and stopped at, a component-suck position, a component-mount position, etc.

The electric-component holding heads 10 are provided on the rotary table 12 such that each of the holding heads 10 is elevated and lowered by an elevating and lowering device, not shown. That is, as the rotary table 12 is rotated, each holding head 10 is revolved about the vertical axis line, while being moved up and down parallel to the vertical axis line on the table 12. In the present embodiment, each holding head 10 takes its highest position at the component-suck position, and takes its lowest position at the component-mount position. At each of the component-suck position and the component-mount position, there is provided an elevating and lowering device, not shown, which elevates and lowers each holding head 10 relative to the rotary table 12, so that at the component-suck position, each holding head 10 is lowered to suck and pick up an electric component from an electric-component supplying device 14. The supplying device 14 supplies, e.g., electric components each of which may, or may not, have lead wires. The holding head 10 holding the electric component is moved to the component-mount position where the holding head 10 is lowered by the elevating and lowering device to mount the electric component on a printed wiring board, not shown. The table driving device; the elevating and lowering device which elevates and lowers each of the electric-component holding heads 10 while the rotary table 12 is rotated; and the elevating and lowering devices each of which elevates and lowers each of the electric-component holding heads 10 at a corresponding one of the component-suck position and the component-mount position are the same as those of the electric-component mounting apparatus disclosed in Japanese Patent Document No. 6-342998, and detailed description thereof is omitted. In the present electric-component mounting apparatus, a plurality of operations, such as component sucking and component mounting, are concurrently carried out at a plurality of stop positions, such as the component-suck position and the component-mount position, so that electric components are mounted on a printed wiring board at short intervals of time, i.e., at a high speed.

Each of the electric-component holding heads 10 is supported by an elevator member 30 which is supported by the rotary table 12 such that the elevator member 30 is movable up and down. A sleeve 32 as a support member is detachably attached to the elevator member 30, and a rod 34 is fitted in the sleeve 32 such that the rod 34 is rotatable relative to the sleeve 32 about a vertical axis line and is not movable relative to the same 32 in axial directions parallel to the vertical axis line. A pair of ear portions 36 extend in opposite directions and outwardly from a lower end portion of the rod 34 that projects out of the sleeve 32, and an attachment member 40 is detachably attached to the two ear portions 36 with respective bolts 42. The rod 34 has a projecting portion 44 having a circular cross section, and the attachment member 40 has a recessed portion 46 which has a circular cross section and in which the projecting portion 44 is fitted. In addition, a positioning pin 48 as a positioning member is fitted in the rod 34 and the attachment member 40. Thus, the rod 34 and the attachment member 40 are positioned relative to each other in all directions perpendicular to the axis line of the rod 34 and opposite directions about the axis line. The projecting portion 44, the recessed portion 46, and the positioning pin 48 provide respective engaging or positioning portions and cooperate with each other to provide a positioning device.

The attachment member 40 supports a nozzle holder 56 such that the nozzle holder 56 is rotatable about a support shaft 58, i.e., an axis line perpendicular to the axis line of the rod 34, e.g., a horizontal axis line parallel to a direction in which the two ear portions 36 are arranged. In the present embodiment, the rod 34, the attachment member 40, and the nozzle holder 56 cooperate with one another to provide a holder member 60; and the nozzle holder 56 provides a nozzle-hold portion of the nozzle holder 60. In the present embodiment, each of the electric-component holding heads 10 is movable in an axial direction parallel to an axis line thereof and is rotatable about the axis line. The nozzle holder 56 holds a plurality of suction nozzles 64 such that the suction nozzles 64 are equiangularly spaced from each other about the axis line of the support shaft 58 and extend radially from the axis line. As the nozzle holder 56 is rotated about the support shaft 58, each of the suction nozzles 64 is selectively positioned at an operative position where the each nozzle 64 is oriented vertically downward and the axis line of the each nozzle 64 is aligned with that of the rod 34. The current rotation position of the nozzle holder 56 is kept because a positioning projection 66 of the attachment member 40 is fitted in an appropriate one of a plurality of positioning recesses 68 of the nozzle holder 56.

The one suction nozzle 64 positioned at the operative position is supplied with a negative pressure via a negative-pressure passage 70 provided in the support shaft 58; a plurality of negative-pressure passages 72 provided in the nozzle holder 56; a negative-pressure passage 74 provided in the attachment member 40; a negative-pressure passage 76 provided in the rod 34; a negative-pressure passage 78 provided in the sleeve 32; a switch valve 80 as a control valve; another negative-pressure passage 82 provided in the sleeve 32; a negative-pressure passage 86 provided in a coupling member 84; and a hose 88. The negative-pressure passage 70 provided in the support shaft 58 communicates with only the one suction nozzle 64 being positioned at the operative position; and the three negative-pressure passages 70, 72, 74 keep communicating with one another even if a rotation position of the nozzle holder 56 relative to the support shaft 58 and the attachment member 40 may be changed when the nozzle holder 56 is rotated. The negative-pressure passage 78 provided in the sleeve 32 keeps communicating with the negative-pressure passage 76 provided in the rod 34, even if the rod 34 may be rotated.

The coupling member 84 is fixed to the sleeve 32, and one end portion of the hose 88 is connected to the coupling member 84. The other end portion of the hose 88 is connected to the rotary table 12, more specifically, a negative-pressure source, not shown, via a negative-pressure passage 90 provided in the rotary table 12 and a negative-pressure passage, not shown, provided in the frame. The connection between the hose 88 and the rotary table 12 is kept even if the rotary table 12 may be rotated, so that the negative pressure is continuously supplied to the one suction nozzle 64. In the present embodiment, the switch valve 80 is mechanically switchable to a supply position where the switch valve 80 permits the negative pressure to be supplied to the one suction nozzle 64, and to a stop position where the switch valve 80 stops the supplying of the negative pressure to the one suction nozzle 64. When the holding head 10 holding the electric component is positioned at the component-suck position, the switch valve 80 of the holding head 10 is switched to its supply position, and is kept at the same position till the holding head 10 reaches the component-mount position. When the holding head 10 is lowered at the component-mount position to mount the electric component on the printed wiring board, the switch valve 80 is switched to the stop position. The construction and operation of the switch valve 80 are the same as those of the switch valve disclosed in Japanese Patent Document No. 10-126097, and detailed description thereof is omitted.

Figure 2:
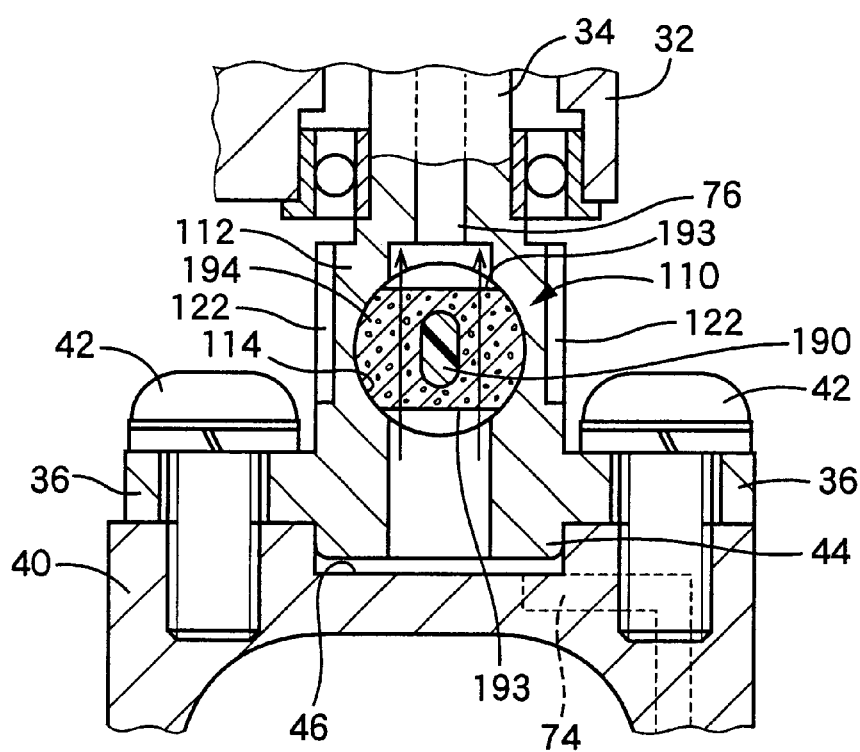
FIG. 2 is a cross-sectioned, rear elevation view of a filter of the electric-component holding head.
Figure 3:
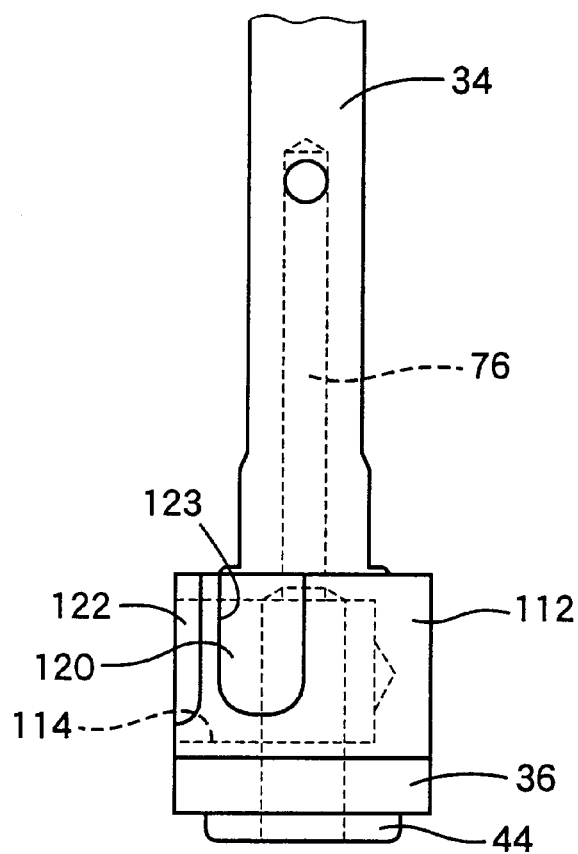
FIG. 3 is a side elevation view of a rod as a holder member of the electric-component holding head.
Figure 4:
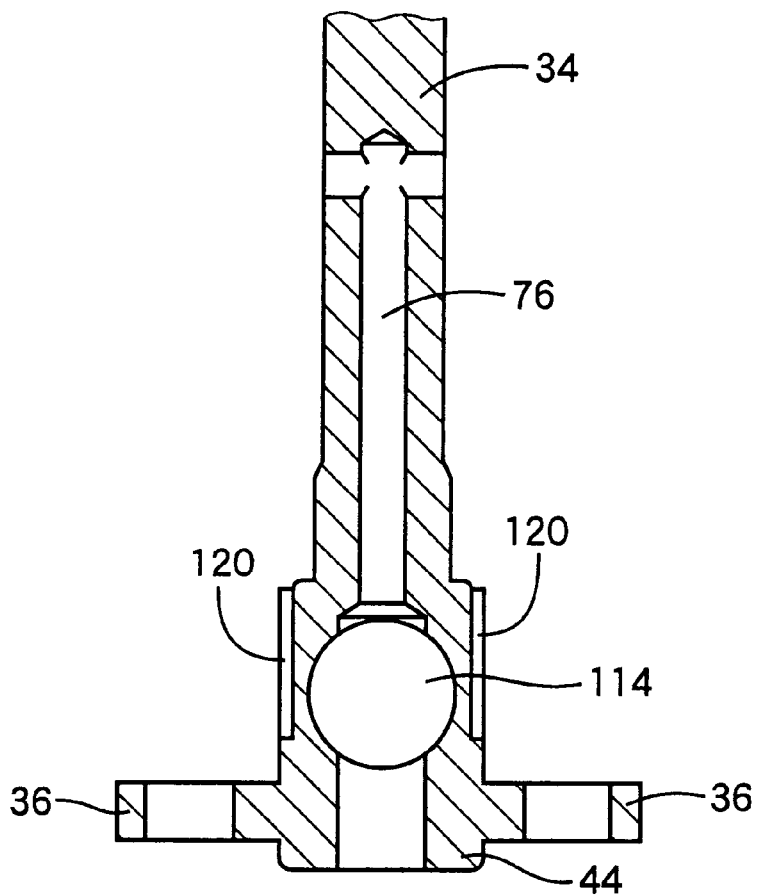
FIG. 4 is a cross-sectioned, front elevation view of the rod.
Figure 5:
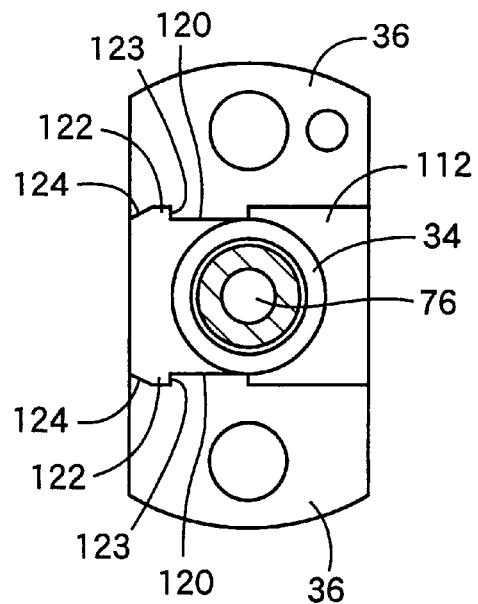
FIG. 5 is a partly cross-sectioned, plan view of a filter-support portion of the rod.
Figure 6:
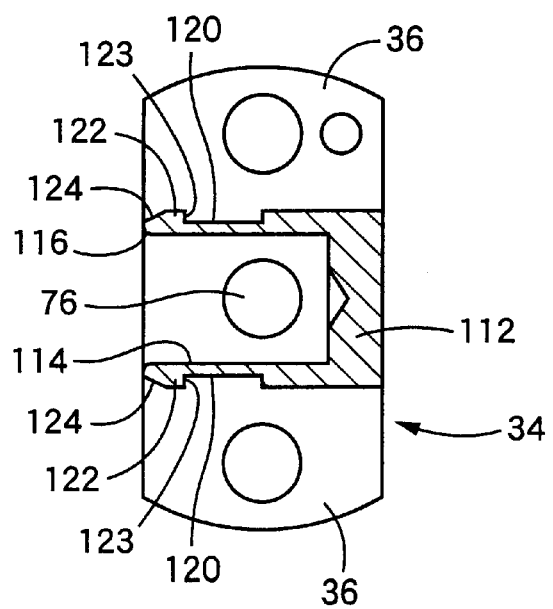
FIG. 6 is a cross-sectioned, plan view of the filter-support portion of the rod.

As shown in FIGS. 1 and 2, a filter 110 is provided in a portion of the negative-pressure passage 76 of the rod 34 that is located on the side of the attachment member 40. As shown in FIGS. 5 and 6, a portion of the rod 34 that is adjacent to the ear portions 36 in the axial direction of the rod 34 provides a filter-support portion 112 having a generally rectangular cross section. As shown in FIGS. 3 and 4, the filter-support portion 112 has a filter-insert blind hole 114 which is formed in the portion 112 to extend perpendicularly to the negative-pressure passage 76, opens in an outer surface of the portion 112, and communicates with the negative-pressure passage 76. The filter-insert hole 114 has a circular cross section, and extends perpendicularly to the direction in which the two ear portions 36 are arranged. An open end portion of the filter-insert hole 114 is chamfered to provide a guide surface 116 whose diameter increases toward the open end.

The filter-support portion 112 has a pair of outer surfaces which are parallel to the axis line of the filter-insert hole 114, and has two recesses 120 which are formed in the two outer surfaces, respectively, and which define respective engaging portions 122 on the side of the open end of the filter-insert hole 114. Those engaging portions 122 provide a first engaging portion. As shown in FIG. 3, the engaging portions 122 are elongate in a direction parallel to the axis line of the negative-pressure passage 76 and, as shown in FIGS. 5 and 6, the two engaging portions 122 define respective engaging surfaces 123 perpendicular to the axis line of the filter-insert hole 114, and have, at respective free ends (on the side of the open end of the filter-insert hole 114), respective inclined surfaces 124 inclined such that each of the inclined surfaces 124 extends outward as viewed in a direction toward the bottom of the hole 114.

Figure 7:
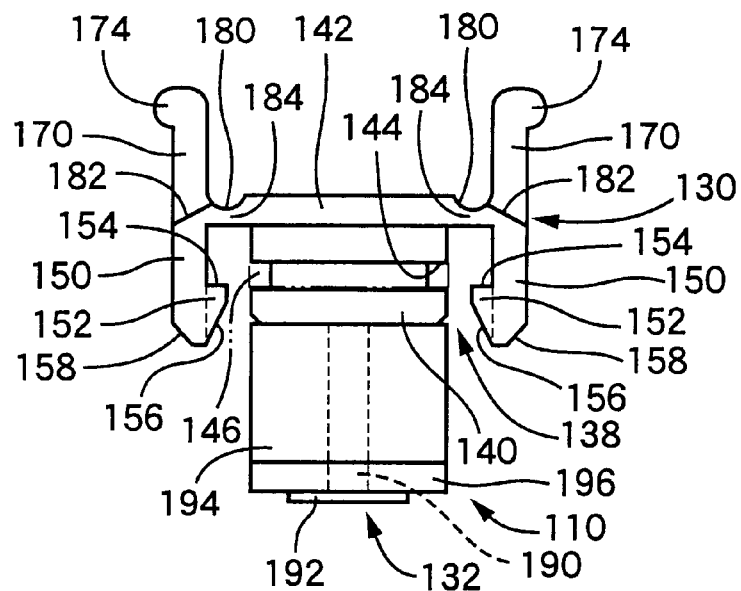
FIG. 7 is a plan view of the filter, a filter-hold member, and a closure member of the holding head.

As shown in FIG. 7, the filter 110 is held by a filter-hold portion 132 as an integral portion of a closure member 130 which closes the opening of the filter-insert hole 114 in the outer surface of the filter-support portion 112 of the rod 34. The closure member 130 and the filter-hold portion 132 are integrally formed of a polypropylene as a synthetic resin as a sort of material which has an elasticity and is transparent. In the present embodiment, the member 130 and the portion 132 are formed of a polypropylene which is mixed with an ultraviolet-ray cutting agent and has a color of light brown. In the present electric-component mounting apparatus, for example, when an image of the electric component held by each suction nozzle 64 is taken, ultraviolet rays are utilized, as follows: Each suction nozzle 64 includes a luminescent plate having a luminescent layer formed by application of a fluorescent coating. When the image of the electric component is taken, the ultraviolet rays are emitted toward the luminescent plate, so that the luminescent plate absorbs the ultraviolet rays and changes them into visible rays, which in turn are emitted toward the electric component. Thus, the ultraviolet-ray cutting agent mixed with the polypropylene prevents the closure member 130 from being deteriorated by exposure to the ultraviolet rays. The polypropylene containing the ultraviolet-ray cutting agent has the color of light brown, but it has the transparency. As the filter 110 continues removing foreign matters contained in the air passing through the filter 110, and becomes dirty little by little, it turns black little by little. Therefore, a person can see to what degree the filter 110 is dirty, through the colored but transparent closure member 130. However, the closure member 130 and the filter-hold portion 132 may be formed of polycarbonate. The closure member 130 includes, in addition to the filter-hold portion 132, a base portion 138 including a closure portion 140 having a short cylindrical shape, and a plate-like portion 142 located at one of axially opposite end portions of the closure portion 140. The closure portion 140 has, in an axially intermediate portion thereof, an annular groove 144 in which an O-ring 146 as a sealing member is fitted. In a state in which the filter 110 is inserted in the filter-insert hole 114, the closure portion 140 is positioned inside the hole 114, but the plate-like portion 142 is positioned outside the hole 114. Since the closure member 130 is completely formed of the transparent polypropylene, starting with an inside surface thereof facing the hole 114 and ending with an outside surface thereof opposite to the inside surface, a person can observe the filter 110, externally through the closure member 130.

Figure 8:
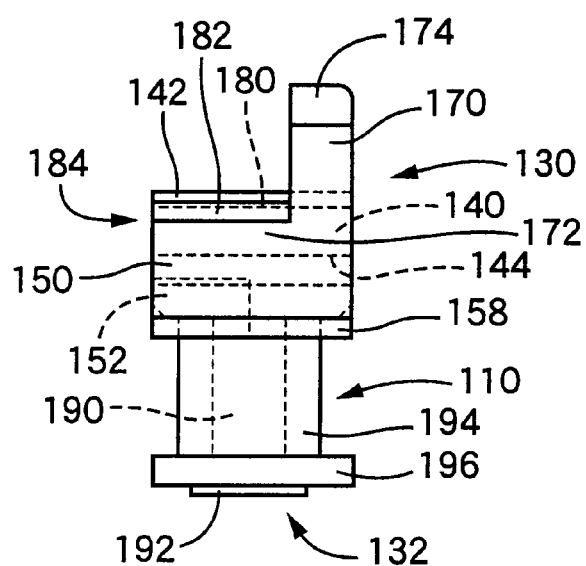
FIG. 8 is a side elevation view of the filter, the filter-hold member, and the closure member.

A pair of arms 150 extend from opposite ends of the plate-like portion 142 that are opposite to each other in a direction perpendicular to the axis line of the closure portion 140. The two arms 150 extend in a direction which is parallel to the axis line of the closure portion 140 and toward the other axial end portion of the closure portion 140 (i.e., the other end portion is opposite to the one end portion thereof at which the plate-like portion 140 is located), e.g., toward the holder member 60. Each of the two arms 150 has the same width as that of the plate-like portion 142 (i.e., the width is a dimension thereof as measured in a direction perpendicular to both the axis line of the closure portion 140 and the direction in which the two arms 150 are spaced from each other). The two arms 150 have respective engaging claws 152 on respective inner surfaces of respective free end portions that are opposed to each other. As shown in FIG. 8, each engaging claw 152 has a width equal to half the width of each arm 150, and is located on a half portion of the inner surface of the arm 150 as viewed in a widthwise direction thereof. As shown in FIG. 7, each engaging claw 152 has an engaging surface 154 which is perpendicular to the direction of extension of each arm 150, and an inclined surface 156 which is inclined such that as the inclined surface 156 runs toward the free end of each arm 150, the surface 156 runs away from the closure portion 140. Thus, it can be said that the two inclined surfaces 156 are provided on the two engaging claws 152 such that as the inclined surfaces 156 run toward the respective free ends of the two arms 150, the surfaces 156 runs away from each other. Respective outer surfaces of the respective free end portions of the two arms 150 are chamfered in the widthwise direction thereof to provide respective inclined surfaces 158.

A pair of operable levers 170 extend from the plate-like portion 142 in a direction opposite to the direction of extension of the pair of arms 150. As shown in FIG. 8, the operable levers 170 are opposite to the engaging claws 152 in the widthwise direction of the plate-like portion 142. Each of a pair of connection portions 172 connects between a corresponding one of the two arms 150 and a corresponding one of the two operable levers 170. The two operable levers 170 have, at respective free end portions thereof, respective engaging portions 174 such that the two engaging portions 174 project outward in opposite directions, respectively. Each of the engaging portions 174 is rounded.

A groove 180 is formed in a portion of the closure member 130 that is located between each of the two connection portions 172 respectively connecting between the two operable levers 170 and the arms 150, and the plate-like portion 142. The two grooves 180 open in a surface of the base portion 138 from which the two operable levers 170 project. The two grooves 180 extend parallel to the widthwise direction of the two arms 150, and perpendicularly to the direction of projection of the two arms 150 and the two operable levers 170. Thus, the portion of the closure member 130 that is located between each connection portion 172 and the plate-like portion 142 has a reduced thickness, so that the two operable levers 170 and the two arms 150 can be easily deformed elastically. In addition, respective root portions of the two arms 150 have respective inclined surfaces 182 which are inclined such that as each of the inclined surfaces 182 runs outward, the each surface 182 runs toward the free end portion of a corresponding arm 150. The inclined surfaces 182 also contribute to increasing the degree of elastic deformation of the two operable arms 170 and the two arms 150. Thus, the grooves 180 and the inclined surfaces 182 cooperate with each other to provide two easily deformable portions 184.

Figure 9:
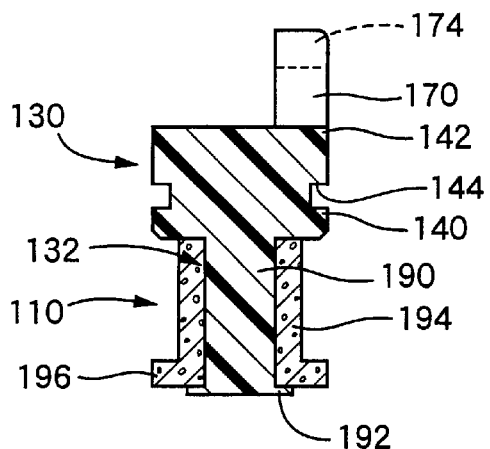
FIG. 9 is a cross-sectioned, side elevation view of the filter, the filter-hold member, and the closure member.
Figure 11:
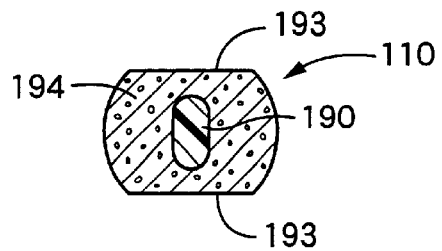
FIG. 11 is a cross-sectioned, front elevation view of the filter and the filter-hold member.

As shown in FIG. 9, the filter-hold portion 132 includes a shank portion 190 which is coaxial with the closure portion of the closure member 130 and extends perpendicularly from the closure portion 140; and a head portion 192 which is provided at a free end of the shank portion 190. As shown in FIG. 11, the shank portion 190 has an oval transverse cross section, that is, a shape defined by a rectangle and two semi-circles located at lengthwise opposite ends of the rectangle. The head portion 192 has a circular shape having a larger diameter than that of the shank portion 190. As shown in FIGS. 7 and 8, the lengthwise direction of the oval transverse cross section of the shank portion 190 is parallel to the widthwise direction of the two arms 150.

In the present embodiment, the filter 110 is formed of a foaming material in an 'insert' method wherein the closure member 130 including the filter-hold portion 132 is inserted or set in dies, a space between the filter-hold portion 132 and the dies is filled with the foaming material, and the foaming material is caused to foam. In this method, when the filter 110 is formed of the foaming material, simultaneously the filter 110 is fixed to the filter-hold portion 132. In the present embodiment, the filter 110 has concatenated air bubbles, a considerably high hardness, and a shape maintaining ability. The resistance of the filter to air can be preferably decreased to facilitate the flow of air through the filter, if the diameter of the bubbles of the filter is decreased. On the other hand, the foreign matters included in the air can be preferably removed by the filter, if the diameter of the bubbles of the filter is increased. Thus, the diameter of air bubbles of the filter 110 depends on which one of the above-mentioned two objects should be thought more important, and on a desired thickness of the filter 110 (i.e., a dimension thereof in a direction of flow of air). In the present embodiment, the average diameter of the bubbles is 0.5 mm, and accordingly the filter 110 removes at least foreign matters greater than 0.5 mm.

Figure 10:
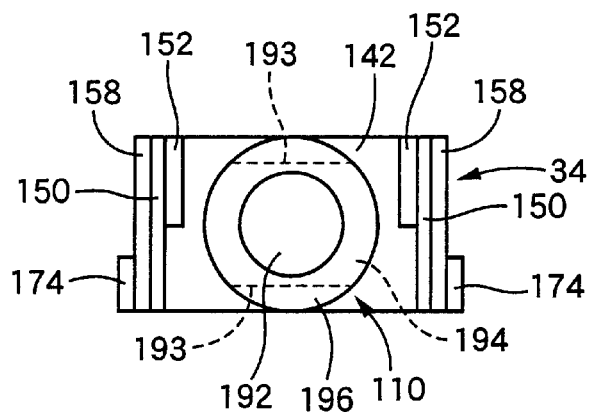
FIG. 10 is a rear elevation view of the filter, the filter-hold member, and the closure member.

As shown in FIGS. 9 to 11, the filter 110 has, except for one end portion thereof as viewed in an axial direction of the cylindrical shape thereof, two flat surfaces 193 which are opposite to each other in a diametric direction thereof and extend parallel to an axis line thereof. Thus, the filter 110 includes an oval portion 194, and a circular portion 196 located at one axial end portion of the oval portion 194, and the filter 110 is supported by the shank portion 190 of the filter-hold portion 132 such that the shank portion 190 extends through the filter 110 and the lengthwise direction of the transverse cross section of the oval portion 194 has a phase perpendicular to that of the shank portion 190. The lengthwise direction of the transverse cross section of the oval portion 194 is perpendicular to the widthwise direction of the two arms 150, and is parallel to the direction in which the two arms 150 are opposed to each other.

Figure 12:
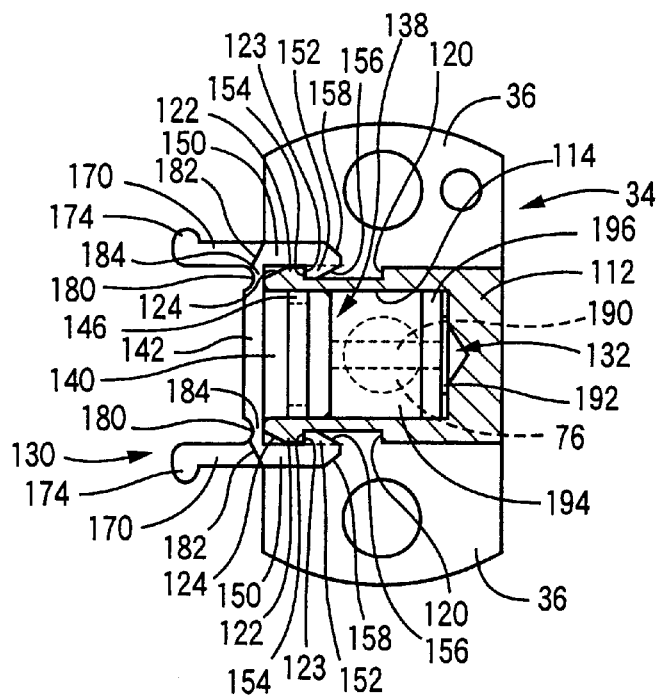
FIG. 12 is a partly cross-sectioned, plan view showing a state in which the filter is attached to the filter-support portion of the rod.
Figure 13:
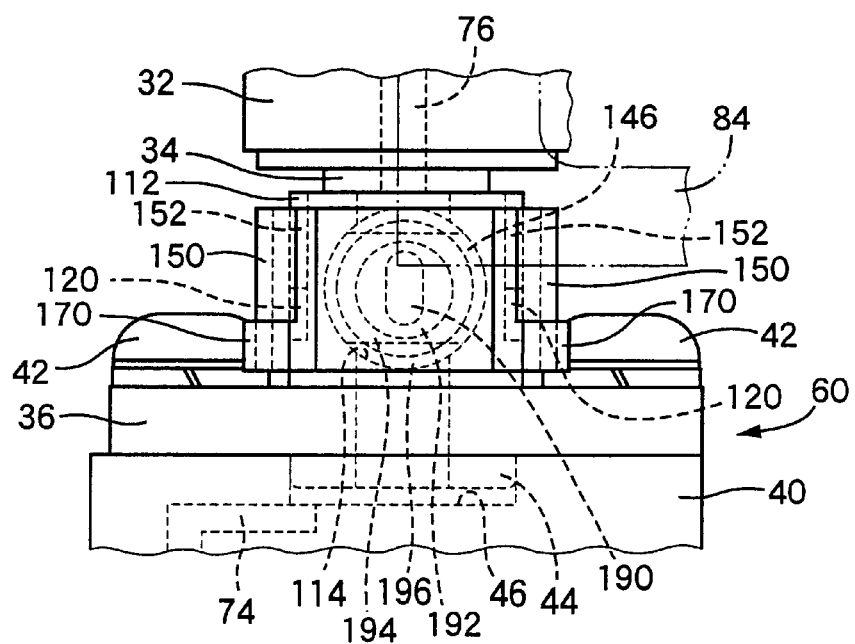
FIG. 13 is a front elevation view showing a state in which the filter is attached to the filter-support portion of the rod.

As shown in FIGS. 12 and 13, in a state in which the filter 110 is fitted in the filter-insert hole 114, and the closure member 140 is fitted in the opening of the hole 114 to close the opening, the O-ring 146 fitted in the groove 144 prevents leakage of the negative-pressure air. In addition, the respective engaging claws 152 of the two arms 150 are fitted in the respective recesses 120, and the two engaging portions 122 are fitted in respective spaces present between the respective base ends of the two arms 150 and the respective engaging surfaces 154 of the engaging claws 152. The length of those spaces (i.e., a dimension thereof in the direction of extension of the arms 150) is somewhat greater than the length of the engaging portions 122 in a direction parallel to the axis line of the filter-insert hole 114, but the difference of the two lengths is smaller than a tolerance. Thus, the engaging portions 122 and the engaging claws 152 are engaged with each other, in such a manner that the engaging surfaces 123, 154 are engaged with each other with some looseness smaller than the tolerance. In this way, the closure member 130 is fixed to the holder member 60. The engaging claws 152 are kept, by the elastic force of the easily deformable portions 184, to the state in which the claws 152 are fitted in the recesses 122, so that the engaging surfaces 123, 154 are kept in engagement with each other. Thus, the filter-hold portion 132 or the closure member 130 does not fall off the holder member 60 during the operation of the electric-component mounting apparatus.

In the above-mentioned state, the widthwise direction of the engaging claws 152 is parallel to the lengthwise direction of the negative-pressure passage 76 and, as shown in FIG. 2, the lengthwise direction of the transverse cross section of the oval portion 194 of the filter 110 is perpendicular to the passage 76, and the lengthwise direction of the transverse cross section of the shank portion 190 of the filter-hold portion 132 is parallel to the passage 76. When each electric-component holding head 10 sucks and holds an electric component, air is sucked in a direction indicated at arrow in FIG. 2 by an air-suction device or a negative-pressure supplying device, not shown, the air enters the filter 110 via the lower flat surface 193 of the oval portion 194 thereof, passes by the shank portion 190, and exits the filter 110 via the upper flat surface 193. Since the shank portion 190 has the oval transverse cross section, it has a large cross section area and a high strength, while minimizing its resistance to the flow of air. In addition, the filter 110 extends perpendicularly to the direction of arrangement of the two ear portions 36, so that the two operable levers 170 of the filter 110 are prevented from being interfered with by the attachment member 40, and the inclined surfaces 158 are provided at the respective free ends of the two arms 150, so that the arms 150 are prevented from being interfered with by the bolts 42.

As shown in FIG. 2, the oval portion 194 of the filter 110 is located in the filter-insert hole 114, such that the air-inlet and air-outlet surfaces 193 of the filter 110 are perpendicular to the negative-pressure passage 76 and are larger than the transverse cross section area of the passage 76. Therefore, the air enters the filter 110 via the large inlet surface 193, passes through the substantially-uniform-thickness portion 194 of the filter 110, and exits the filter 110 via the large outlet surface 193. Thus, the foreign matters contained in the air passing through the negative-pressure passage 76 are uniformly removed by the substantially entirety of the filter 110, so that the entirety of the filter 110 is made substantially uniformly dirty. As shown in FIG. 12, there is left a small space between the head portion 192 of the filter-hold portion 132 and the filter-insert hole 114. However, since the filter 110 includes the circular portion 196 which isolates this space from the negative-pressure passage 76, the air is prevented from flowing through the space without flowing through the filter 110.

The closure member 130 including the filter-hold portion 132 is formed of the transparent polypropylene which is mixed with the ultraviolet-ray cutting agent and has the color of light brown. Since the closure member 130 partly defines an outer surface of the holder member 60, an operator can externally see the filter 110 through the closure member 130 and check how dirty the filter 110 is. Though the O-ring 146 is fitted on the closure portion 140, the ring 146 is located along the outer periphery of the closure portion 140. Therefore, the ring 146 does not prevent the operator from inspecting how dirty the filter 110 is. This inspection is carried out at a timing, e.g., after a prescribed period has passed from the time when the current filter 110 was attached to the holder member 60. This period is prescribed in terms of weeks, such that the inspection is done somewhat earlier than expected, i.e., the filter 110 is inspected before it is made too dirty.

Each electric-component holding head 10 usually takes a phase at which the support shaft 58 of the nozzle holder 56 thereof extends perpendicularly to the axis of rotation of the rotary table 12, the filter 110 thereof extends parallel to a tangential direction with respect to the locus of rotation of the rotary table 12, and the operable levers 170 of the closure member 130, and the coupling member 84 take the same phase with respect to the axis line of the each holding head 10. The two operable levers 170 are on one side of the plate-like portion 142, i.e., are opposite to the engaging claws 152, and are prevented from being interfered with by the coupling member 84 at the above-indicated phase. Accordingly, the operator can observe how dirty the filter 110 is, by first rotating the holder member 60 relative to the sleeve 32 so that the closure member 130 is moved to a filter-observe or filter-replace position which is away from the coupling member 84 about the axis line of the holding head 10 and which faces radially outwardly of the rotary table 12, and then seeing the filter 110 through the transparent closure member 130 partly defining the outer surface of the holder member 60. That is, the operator can see how dirty the filter 110 is, without detaching the filter 110 from the holder member 60. If the filter 110 is so dirty as to need to be replaced with a new one, the operator detaches the filter 110 from the holder member 60, and attaches the new filter 110 to the same 60. But, if not, the operator does not replace the current filter 110, and determines a timing when the next inspection is to be carried out, so that he or she inspects again the filter 110 at that timing.

The filter 110 is held by the filter-hold portion 132 formed as being integral with the closure portion 140. Accordingly, the filter 110 together with the closure member 130 is attached to, and detached from, each electric-component holding head 10. Since the closure member 130 has been positioned, owing to the rotation of the holding head 10, at the position which is away from the coupling member 84 about the axis line of the holding head 10, the operator can operate the two operable levers 170 and detach the filter 110, without being interfered with by the coupling member 84. Since the closure member 130 including the filter-hold portion 132 is formed of the material containing the ultraviolet-ray cutting agent and is protected from deterioration due to ultraviolet rays, the closure member 130 is prevented from coming off the holder member 60 because of being deteriorated and broken. In addition, the operator can operate the closure member 130, without breaking the same 130, and detach the filter 110 from the holder member 60.

The operator grips, with his or her two fingers, the two operable levers 170, and elastically deforms the same 170 so that the respective free end portions of the levers 170 are moved toward each other. The deformation of the two operable levers 170 is transmitted via the connection portions 172 to the two arms 150, so that the two arms 150 are elastically deformed such that the respective free end portions of the arms 150 are moved away from each other. Consequently the two engaging claws 152 are moved away from the two recesses 120, respectively, and are thus disengaged from the two engaging portions 122, respectively. Since the closure member 130 has the easily deformable portions 184, the two operable levers 170 and the two arms 150 are easily elastically deformed relative to the base portion 138. Then, if the filter 110 is pulled out through the filter-insert hole 114 in the state in which the engaging claws 152 are kept away from the engaging portions 122, the filter 110 is detached from the holder member 60. During this operation, the head portion 192 prevents the filter 110 from coming off the shank portion 190.

When the operator attaches the filter 110 to the holder member 60, he or she inserts the filter 110 in the filter-insert hole 114 in a state in which the O-ring 146 is fitted in the groove 144 of the closure portion 140. The insertion of the filter 110 into the hole 114 is guided by the guide surface 116. As the filter 110 is fitted in the hole 114, the respective inclined surfaces 156 of the two engaging claws 152 are engaged with the respective inclined surfaces 124 of the two engaging portions 122, so that the two arms 150 are elastically deformed to be moved away from each other. That is, the two arms 150 are widely opened, so that the two engaging claws 152 climb over the two engaging portions 122, respectively, and then engage the two recesses 120, respectively. Thus, the engaging claws 152 are engaged with the engaging portions 122. Owing to the respective elastic forces of the two easily deformable portions 184, the two engaging claws 152 and the two engaging portions 122 are kept in engagement with each other, respectively, and the closure member 130 is prevented from falling off the holder member 60 and continues to close the opening of the filter-insert hole 114. Thus, the operator can attach the filter 110 to the holder member 60 by just inserting the filter 110 into the filter-insert hole 114, without using any tools. In addition, since the closure member 130 has the easily deformable portions 184, the two arms 150 are easily elastically deformed and accordingly the filter 110 is easily attached. In the present embodiment, each of the two easily deformable portions 184 functions not only as a hinge as an attaching device which attaches a corresponding one of the two arms 150 and a corresponding one of the two operable levers 170 to the base portion 138 of the closure member 130, such that the one arm 150 and the one lever 170 are pivotable relative to the base portion 138, but also as an elastic member which keeps the engagement of a corresponding one of the two engaging portions 122 and a corresponding one of the two engaging claws 152. Since the shank portion 190 has the oval transverse cross section, the shank portion 190 prevents the rotation of the filter 110 relative to the filter-hold portion 132, so that the oval portion 194 of the filter 110 is kept to the state in which the lengthwise direction of the transverse cross section of the portion 194 is perpendicular to the negative-pressure passage 76 and the two flat surfaces 193 of the same 194 traverse the passage 76. In this state, the filter 110 removes the foreign matters present in the air passing through the passage 76. After the operator attaches the filter 110, he or she rotates the holder member 60 till the holder member 60 takes its correct phase about the axis line of the holding head 10, i.e., phase before the replacement of filter 110.

It emerges from the foregoing description that in the present embodiment, the filter 110 can be attached to, or detached from, the holder member 60, without disassembling the holder member 60, and without using any tools, by a single action in a short time. Therefore, the time needed to stop the operation of the electric-component mounting apparatus to replace the filter 110 with a new one, can be minimized. In addition, since the operator can externally see the filter 110 through the transparent closure member 130, he or she can replace the filter 110 with a new one at an appropriate timing.

Figure 14:
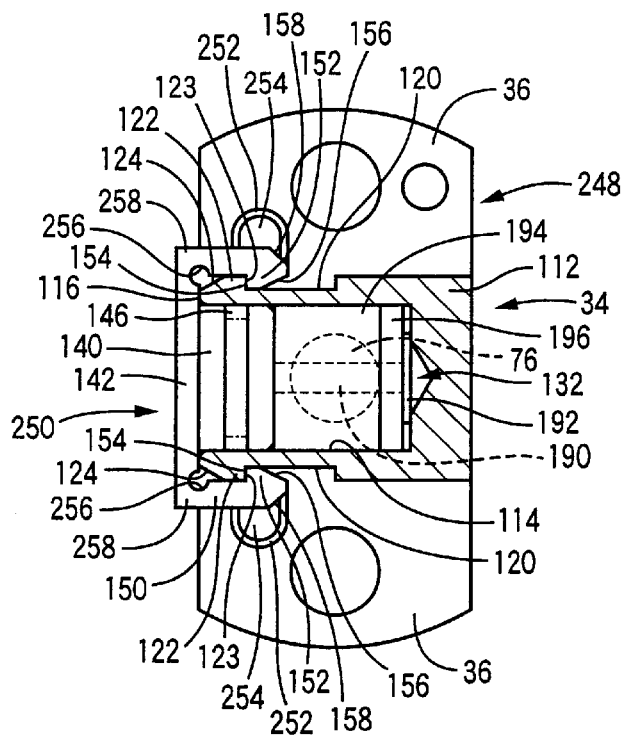
FIG. 14 is a partly cross-sectioned, plan view showing a state in which a filter is attached to a holder member of an electric-component holding head as a second embodiment of the present invention.

In the above-described embodiment, the two operable levers 170 provide two operable portions which are operable to operate the two arms 150, respectively. However, the two operable portions may be provided at the respective free end portions of the two arms 150 such that each of the two operable portions is opposite to the engaging claw 152 of the free end portion of a corresponding one of the two arms 150. This manner will be described by reference to a second embodiment shown in FIG. 14. The same reference numerals as used in the first embodiment shown in FIGS. 1 to 13 are used to designate the corresponding elements and parts of the second embodiment shown in FIG. 14, and the description thereof is omitted.

The second embodiment relates to an electric-component holding head 248 which may be employed in the electric-component mounting apparatus shown in FIG. 1. The holding head 248 employs a closure member 250 including two knobs 252 which are provided on respective outer surfaces of the respective free end portions of the two arms 150 extending from the plate-like portion 142, such that the two knobs 252 are opposite to the two engaging claws 152, respectively. The two knobs 252 provide the two operable portions, respectively. Each of the knobs 252 has a recess 254 opening upward. In addition, the closure member 130 has two grooves 256 at respective root portions of the two arms 150, such that the grooves 256 extend parallel to the widthwise direction of the arms 150. Each of the two grooves 256 decreases the thickness of a corresponding one of the respective root portions of the two arms 150, thereby providing an easily deformable portion 258.

When the operator detaches the filter 110 from the filter-insert hole 114, he or she grips, with his or her fingers, the two knobs 252, and elastically deforms the two arms 150 so that the respective free end portions of the two arms 150 are pivoted and moved away from each other. Consequently the two engaging claws 252 are disengaged from the two engaging portions 122, respectively, and, in this state, the filter 110 is pulled out from the hole 114. Since the two knobs 252 have the respective recesses 254, the operator can easily grip the knobs 254. In addition, since the closure member 130 has the two easily deformable portions 258, the two arms 150 can be easily elastically deformed. When the operator inserts the filter 150 to the filter-insert hole 114, he or she first grips the closure member 130 and then inserts the filter 110 into the hole 114. As the filter 110 is inserted in the hole 114, the two arms 150 are elastically deformed while the two engaging claws 152 climb over the two engaging portions 122, respectively, and engage the two recesses 120, respectively. Thus, the two engaging claws 152 are engaged with the two engaging portions 122, respectively. Owing to the respective elastic forces of the arms 150 and the easily deformable portions 258, the engaging claws 152 are kept to the state in which the claws 152 are fitted in the recesses 120 and are engaged with the engaging portions 122. In the present embodiment, the arms 150 also function as the elastic members, and the easily deformable portions 258 function not only as the attaching devices which attach the arms 150 to the plate-like portion 140 such that the arms 150 are pivotable relative to the portion 140, but also as the elastic members.

Figure 15:
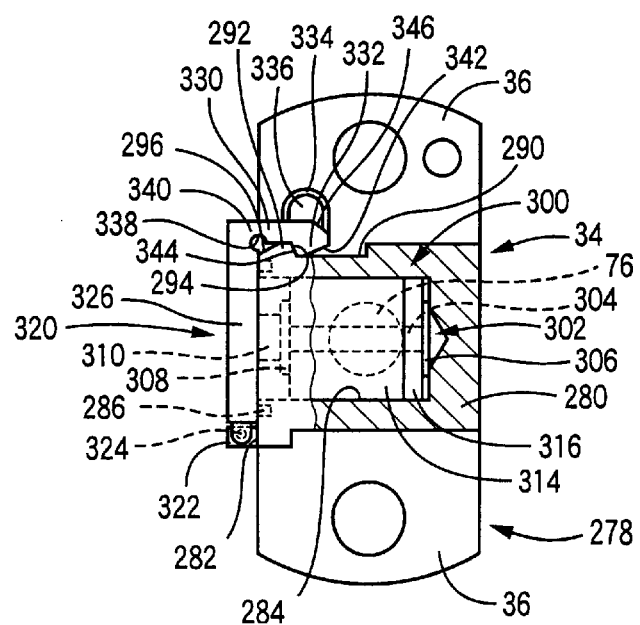
FIG. 15 is a partly cross-sectioned, plan view showing a state in which a filter is attached to a holder member of an electric-component holding head as a third embodiment of the present invention.
Figure 16:
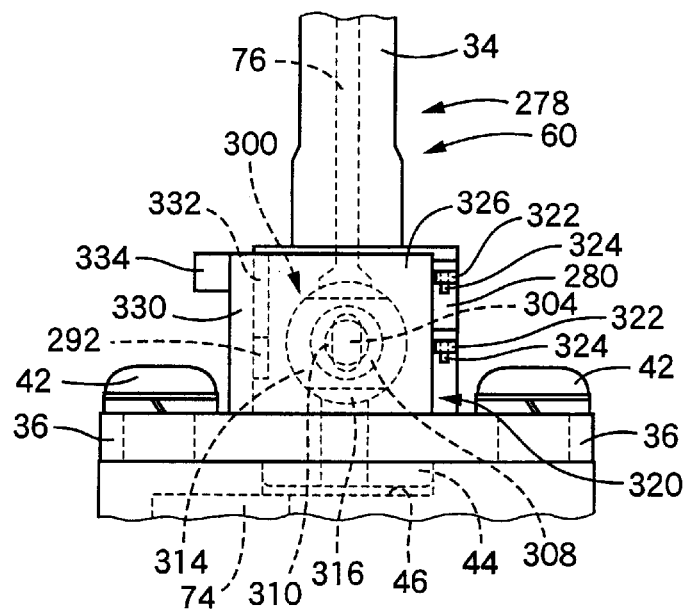
FIG. 16 is a front elevation view showing the state in which the filter is attached to the holder member of the electric-component holding head of FIG. 15.

In each of the above-described embodiments, the filter-hold portion 132 is formed as an integral portion of the closure member 130, 250. However, it is possible to employ a filter-hold member which is separate from a closure member. In addition, it is possible to employ a closure member which is attached to the holder member 60 such that the closure member is pivotable relative to the member 60. Those manners will be described by reference to a third embodiment shown in FIGS. 15 and 16. The third embodiment relates to an electric-component holding head 278 which may be employed in the electric-component mounting apparatus shown in FIG. 1. The rod 34 of the holding head 278 includes a filter-support portion 280 having a filter-insert hole 284 which opens in an outer surface 282 of the portion 280 and reaches the negative-pressure passage 76. An O-ring 286 as a sealing member is provided around the opening of the hole 284 in the outer surface 282. The filter-support portion 280 further has, in one side surface thereof perpendicular to the outer surface 282, a recess 290 and an engaging portion 292. As shown in FIG. 15, an end surface of the engaging portion 292 that defines the recess 290 provides an inclined surface 294 which is inclined such that as the inclined surface 294 runs away from the filter-insert hole 284 in a radial direction thereof, the surface 294 runs toward the opening of the hole 284. The engaging portion 292 has an inclined surface 296 which is inclined such that as the inclined surface 296 runs away from the filter-insert hole 284 in a radial direction thereof, the surface 296 runs away from the opening of the hole 284.

A filter 300 is held by a filter-hold member 302. The filter-hold member 302 includes a shank portion 304 having an oval transverse cross section; two circular head portions 306, 308 provided at respective opposite end portions of the shank portion 304 as viewed in an axial direction parallel to an axis line thereof and a knob 310 projecting from one head portion 308. In the present embodiment, the filter-hold member 302 is formed of a transparent polypropylene which contains an ultraviolet-ray cutting agent and has a color of light brown. The filter 300 is formed like the above-described filter 110, i.e., formed of a foaming material in an insert method, and includes an oval portion 314 and a circular portion 316. The head portions 306, 308 prevent the filter 300 from coming off the shank portion 304.

The closure member 320 has a plate-like configuration, and is formed of a transparent polypropylene which contains an ultraviolet-ray cutting agent and has a color of light brown. The closure member 320 is attached to two attaching portions 322 projecting from the outer surface 282 of the filter-support portion 280, and respective axis portions 324 of the two attaching portions 322 cooperate with each other to support the closure member 320, such that the closure member 320 is pivotable about an axis line which is parallel to the negative-pressure passage 76 and is perpendicular to a direction parallel to the centerline of the filter-insert hole 284. The closure member 320 includes a closure portion 326 which is attached with the axis portions 324 to the filter-support portion 280, and an arm 330 which extends toward the holder member 60 from one end portion of the closure portion 326 that is opposite to the other end portion of the same 326 attached to the filter-support portion 280.

The arm 330 has an engaging claw 332 at a free end portion thereof. The engaging claw 332 has an inclined surface 342 which is inclined such that as the inclined surface 342 runs toward the filter-support portion 280, the surface 342 runs toward the closure portion 326; and an inclined surface 344 which is adjacent to the inclined surface 342 and is inclined such that as the inclined surface 344 runs toward the filter-support portion 280, the surface 344 runs away from the closure portion 326. The inclined surface 344 has an inclination corresponding to that of the inclined surface 294 of the engaging portion 292. An outer surface of the free end portion of the arm 330 is chamfered along the widthwise direction thereof, to provide an inclined surface 346. In addition, the arm 330 has a knob 334 which is provided on the outer surface thereof such that the knob 334 is opposite to the engaging claw 332. The knob 332 has a recess 336 opening upward. The closure member 320 has, at a root portion of the arm 330, a groove 338 which extends in the widthwise direction of the arm 330. The groove 338 provides an easily deformable portion 340 of the closure member 320.

The filter 300 is inserted in the filter-insert hole 284, and the closure member 320 is elastically engaged with the filter-support portion 280 such that the engaging claw 332 and the engaging portion 292 are engaged with each other, i.e., the two inclined surfaces 294, 344 are engaged with each other. The inclined surfaces 294, 344 have a small inclination angle and, based on a pushing force of the engaging claw 332 applied to the engaging portion 292, mainly because of the elastic force of the easily deformable portion 340, the engaging portion 292 produces a pushing force applied to the engaging claw 332, so that the closure portion 326 of the closure member 320 is biased in a direction toward the outer surface 282 of the filter-support portion 280 and is elastically pressed against the O-ring 286. The O-ring 286 has a size which can accommodate a looseness left between the axis portion 324 of each attaching portion 322 and a hole of the closure member 320 in which the axis portion 324 is fitted. Thus, the closure portion 326 is held in close contact with the O-ring 286, to prevent leakage of the negative-pressure air. In this state, the closure member 320 is kept to the state in which the closure member 320 closes the opening of the filter-insert hole 284. Thus, the filter 300 is prevented from falling off the hole 284.

Since the filter-hold member 302 and the closure member 320 are formed of the transparent material, an operator can see, from outside the holder member 60, the filter 300 through the filter-hold member 302 and the closure member 320, and inspect whether the filter 300 is dirty to such a degree that the filter 300 needs to be replaced with a new one. When the operator replaces the filter 300 with a new one, he or she grips, with his or her fingers, the knob 334, and elastically deforms the arm 330 to pivot the same 330, so that the engaging claw 332 is disengaged from the engaging portion 292. Then, the operator pivots the closure member 320 about the common axis line of the two axis portions 324, to open the opening of the filter-insert hole 284. In this state, the operator pulls the knob 334 of the filter-hold member 302, and thereby draws the filter 300 out of the hole 284. After a new filter 300 is inserted into the hole 284, the closure member 320 is pivoted, and the arm 330 is elastically deformed to cause the engaging claw 332 to climb over the engaging portion 292 and engage the same 292. Since the closure member 320 has the easily deformable portion 340, the arm 330 is easily elastically deformed. In this state, the engaging claw 332 is elastically engaged with the engaging portion 292, to keep the closure member 320 to the state in which the closure portion 326 of the closure member 320 closes the opening of the filter-insert hole 284 and is held in close contact with the O-ring 286. In the present embodiment, the two attaching portions 322 and the two axis portions 324 cooperate with each other to provide an attaching device which attaches the closure member 320 to the holder member 60; the engaging portion 292 and the engaging claw 332 cooperate with each other to provide a closed-state keeping device which keeps the state in which the closure member 320 closes the filter-insert hole 284; and the easily deformable portion 340 provides not only the attaching device which attaches the arm 330 to the closure portion 326 such that the arm 330 is pivotable relative to the closure portion 326, but also the elastic member which keeps the engagement of the engaging claw 332 and the engaging portion 292.

Figure 17:
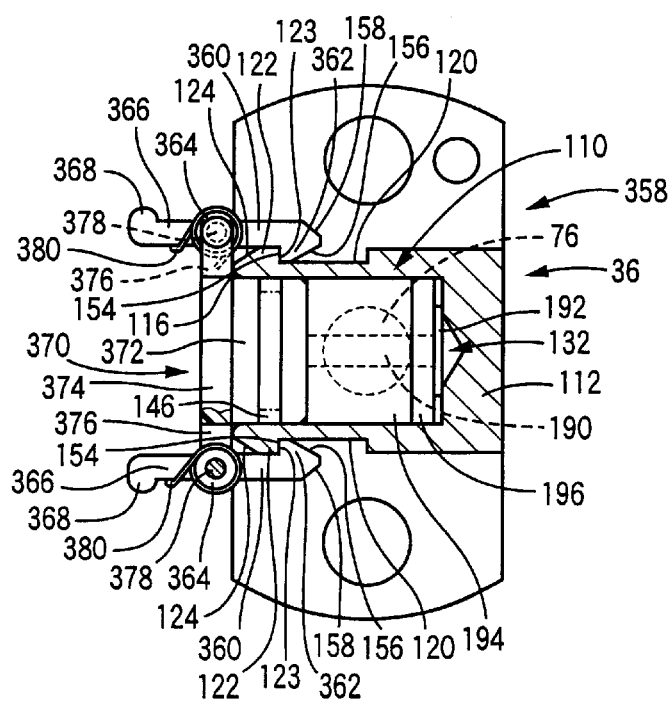
FIG. 17 is a partly cross-sectioned, plan view showing a state in which a filter is attached to a holder member of an electric-component holding head as a fourth embodiment of the present invention.

In each of the above-described embodiments, the second engaging portion 150, 330 is formed as being integral with the closure member 130, 250, 320. However, it is possible to employ an engaging member which is attached to a closure member such that the engaging member is pivotable relative to the closure member. This manner will be described by reference to a fourth embodiment shown in FIG. 17.

The fourth embodiment relates to an electric-component holding head 358 which may be employed in the electric-component mounting apparatus shown in FIG. 1. The holding head 358 employs two engaging members 360 each of which has a shape similar to that of each of the arms 150 employed in the first and second embodiment. The two engaging members 360 have respective engaging claws 362 at respective one free end portions thereof, and have respective cylindrical boss portions 364 at the respective other end portions thereof. Two operable levers 366 having a construction similar to that of the operable levers 170 employed in the first embodiment extend from the two boss portions 364, respectively, in a direction opposite to the direction of extension of the engaging members 360. Each of the two operable levers 366 is formed as being integral with a corresponding one of the two engaging members 360. The operable levers 366 are prevented from being interfered with by the coupling member 84, and have respective engaging portions 368 at respective free end portions thereof.

A closure member 370 includes a base portion 372 which includes a plate-like portion 374 having two pairs of ear portions 376 on opposite side surfaces thereof, respectively, that are distant from each other in a direction perpendicular to an axis line of the filter 110. Each of the two boss portions 364 is fitted between a corresponding one pair of the two pairs of ear portions 376. An axis member 378 extends through the each boss portion and the corresponding pair of ear portions 376, so that a corresponding engaging member 360 is attached to the closure member 370 such that the engaging member 360 is pivotable relative to the same 370. Opposite end portions of a torsion spring 380 as a sort of biasing device are engaged with each of the two operable levers 366 and a corresponding one pair of the two pairs of ear portions 376, so as to bias a corresponding one of the two engaging claws 362 in a direction to engage a corresponding one of the two recesses 120 and thereby keep the one engaging claw 362 to a state in which the claw 362 is engaged with a corresponding one of the two engaging portions 122. The limit of pivotal motion of each of the two engaging members 360 biased by a corresponding one of the two torsion springs 380 is defined by a stopper, not show, provided on the closure member 370. In a state in which the engaging claws 362 are engaged with the recesses 120 or the engaging portions 122, the stopper causes the torsion springs 380 to bias the engaging members 360; and in a state in which the closure member 370 is not attached to the holder member 60, the stopper keeps the engaging members 360 at respective positions where the engaging members 360 cannot be contacted with the base portion 372 but can be widely opened when the filter 110 is inserted into the filter-insert hole 114 and the two inclined surfaces 124, 156 are engaged with each other.

When an operator detaches the filter 110 through the filter-insert hole 114, he or she grips, with his or her fingers, respective engaging portions 368 of the two operable levers 366, and pivots the two levers 366, against the respective biasing forces of the two torsion springs 380, in a direction in which the two levers 366 are moved toward each other. Consequently the two engaging members 360 are pivoted, so that the two engaging claws 362 are disengaged from the two engaging portions 122, respectively. In this state, the filter 110 is taken out of the filter-insert hole 114.

When the operator attaches the filter 110 to the holder member 60, he or she grips the closure member 370 and inserts the filter 110 into the filter-insert hole 114. The engaging members 360 are pivoted because of the inclination of the inclined surfaces 156, 124 against the biasing forces of the torsion springs 380, so that the engaging claws 362 climb over the engaging portions 122 and engage the recesses 122. Thus, the engaging members 360 are engaged with the engaging portions 122.

In the above-described embodiments, the filter 110, 300 is fixed to the filter-hold member 132, 302, by the insert method. However, it is possible to produce a filter separately from a filter-hold member and fix, with an adhesive, the filter to the filter-hold member. Alternatively, it is possible that a filter be detachably attached to a filter-hold member. In the latter case, the filter may have a hole for the filter-hold member to be fitted therein. If the hole has a transverse cross section similar to that of a fitting portion of the filter-hold member that is to be fitted in the hole, the filter is easily attached to, and detached from, the filter-hold member. In addition, it is preferred that the filter-hold member include a preventing portion which prevents the filter from coming off the filter-hold member, for example, a head portion having an outer dimension larger than an inner dimension of the hole of the filter. Since a filter which is formed of a foaming material has an excellent nature of being elastically deformed, the filter can be easily attached to the filter-hold member including the preventing portion.

In each of the illustrated embodiments, the filter 110, 300 has the concatenated air bubbles each having the average diameter of 0.5 mm. However, the diameter of air bubbles of the filter may not be limited to 0.5 mm but may be selected from appropriate ranges including a range of not smaller than 0.2 mm and smaller than 0.4 mm, a range of not smaller than 0.4 mm and smaller than 0.6 mm, and a range of not smaller than 0.6 mm and not greater than 0.8 mm. Which range is selected depends on which one of the degree of air flowing ability and the degree of foreign-matter removing ability should be thought taken more important.

The two operable levers 170 may be provided such that the two levers 170 are aligned with the two engaging claws 152, respectively, in the widthwise direction of the two arms 150, if there is no need to prevent the two levers 170 from being interfered with by other members. That is, each engaging claw 152 and a corresponding operable lever 170 may be provided on a straight line parallel to the direction of extension of a corresponding arm 150.

In each of the illustrated embodiments, the holder member 60 is one which is obtained by assembling a plurality of constituent members. However, the holder member 60 is one which cannot be disassembled.

In each of the illustrated embodiments, the closure member 130, 250, 320, 370 of the electric-component holding head 10, 248, 278, 358 is formed of the transparent material. However, this is not essentially needed, and a closure member may be formed of an opaque material. In the latter case, too, the filter 110, 300 may be detached from the holder member 60, without disassembling the holder member, and thus the filter can be easily attached to, and detached from, the holder member. If the degree of dirtiness of the filter detached from the holder member is checked and it is found that the filter can be used further, the filter may be used further. Since, for checking the degree of dirtiness of the filter, the operator needs to detach the filter from the holder member, the filter checking operation is more cumbersome. However, the filter can be replaced with a new one, or be cleaned, at an appropriate timing, depending upon when the checking operation is done.

The twelfth feature (12) described in SUMMARY OF THE INVENTION is also applicable to an electric-component holding head wherein no closure member is employed, a filter is accommodated in an accommodating portion of a holder member, and replacement of the filter with a new one needs to disassemble the holder member. In this case, for example, at least a portion of the accommodating portion of the holder member, that is, a portion of the holder member that is located between an inner surface facing the filter and an outer surface facing outside the head may be formed of a transparent material, so that an operator can see the filter from outside the head.

The present invention is applicable to not only the above-described electric-component mounting apparatus which includes the rotary table 12 and the plurality of electric-component holding heads 10 which are moved, as the rotary table 12 is rotated, to the component-mount position where the holding heads 10 mount respective electric components, but also an electric-component mounting apparatus which includes at least one electric-component holding head and a movable member which supports the holding head and is moved in two directions perpendicular to each other on a plane, e.g., a horizontal plane so that the holding head mounts an electric component on a printed circuit board, or an electric-component mounting apparatus which includes at least one electric-component holding head and a movable member which supports the holding head and is moved in one direction so that the holding head mounts an electric component on a printed circuit board. The latter electric-component mounting apparatuses are used to mount so-called special-form components, such as capacitor or resistor. In addition, the present invention is applicable to other apparatuses than the electric-component mounting apparatuses, such as an electric-component transferring apparatus which employs at least one electric-component holding head to transfer an electric component.

While the present invention has been described in detail in its preferred embodiments, it is to be understood that the present invention is by no means limited to the details of those embodiments but may be embodied with not only the features (1) to (12) described in SUMMARY OF THE INVENTION but also other changes, modifications, and improvements that may occur to one skilled in the art without departing from the scope and spirit of the present invention defined in the appended claims.

What is claimed is:

1. An electric-component holding head, comprising:
   a holder member including a nozzle-hold portion which holds a suction nozzle, and having a substantially straight negative-pressure passage through which a negative pressure is supplied to the suction nozzle so that the suction nozzle holds an electric component by applying the negative pressure thereto;
   a filter which is provided in an intermediate portion of the substantially straight negative-pressure passage and removes foreign matters present in an air passing through the filter;
   the holder member having an outer surface and a filter-insert hole which has an opening in the outer surface and extends substantially perpendicularly to the substantially straight negative-pressure passage so as to communicate between the outer surface and the intermediate portion of the negative-pressure passage so that the filter is inserted from outside the holder member via the filter-insert hole into the intermediate portion of the negative-pressure passage; and
   a closure member which closes the opening of the filter-insert hole.

2. A head according to claim 1, wherein the closure member includes (a) a closure portion which closes the opening of the filter-insert hole, and (b) a filter-hold portion which holds the filter.

3. A head according to claim 1, wherein the holder member further includes a first engaging portion, wherein the closure member includes a second engaging portion which engages the first engaging portion of the holder member and thereby fixes the closure member to the holder member, and wherein the head further comprises an elastic member which provides an elastic force with which the first and second engaging portions are kept in engagement with each other.

4. A head according to claim 1, further comprising:
   an attaching device which attaches the closure member to the holder member such that the closure member is pivotable relative to the holder member; and
   a closure-state keeping device which keeps a state in which the closure member closes the opening of the filter-insert hole.

5. A head according to claim 1, wherein the closure member is formed of a substantially transparent material so that in a state in which the closure member closes the opening of the filter-insert hole, the filter is visible from outside the holder member through the closure member.

6. An electric-component holding head according to claim 1, wherein the nozzle-hold portion of the holder member holds a plurality of suction nozzles, and the substantially straight negative-pressure passage of the holder member comprises a common negative-pressure passage which commonly communicates with the plurality of suction nozzles and through which a negative pressure is supplied to each one of the suction nozzles so that said one suction nozzle holds an electric component by applying the negative pressure thereto, and wherein the filter is provided in the common negative-pressure passage.

7. A head according to claim 6, wherein the closure member is formed of a substantially transparent material so that in a state in which the closure member closes the opening of the filter-insert hole, the filter is visible from outside the holder member through the closure member.

8. An electric-component holding head, comprising:
   a holder member including a nozzle-hold portion which holds a suction nozzle, and having a negative-pressure passage through which a negative pressure is supplied to the suction nozzle so that the suction nozzle holds an electric component by applying the negative pressure thereto;
   a filter which is provided in the negative-pressure passage and removes foreign matters present in an air passing through the filter;
   the holder member having an outer surface and a filter-insert hole which has an opening in the outer surface and communicates between the outer surface and the negative-pressure passage so that the filter is inserted from outside the holder member via the filter-insert hole into the negative-pressure passage; and
   a closure member which closes the opening of the filter-insert hole,
   wherein the holder member further includes a first engaging portion, wherein the closure member includes a second engaging portion which engages the first engaging portion of the holder member and thereby fixes the closure member to the holder member, and wherein the head further comprises an elastic member which provides an elastic force with which the first and second engaging portions are kept in engagement with each other,
   wherein the second engaging portion of the closure member comprises a pair of arms which extend toward the holder member and have respective engaging claws at respective free end portions thereof.

9. A head according to claim 8, wherein the closure member further includes at least one operable portion which is operable to move at least one of the pair of arms away from the other of the arms.

10. A head according to claim 9, wherein the closure member includes, as the at least one operable portion, a pair of operable levers which extend in a direction opposite to a direction in which the pair of arms extend toward the holder member, and further includes a pair of connection portions each of which connects between a corresponding one of the pair of arms and a corresponding one of the pair of operable levers; a base portion; a pair of easily deformable portions each of which is provided between a corresponding one of the pair of connection portions and the base portion and is more easily elastically deformable than said one connection portion and the base portion, and wherein when the pair of levers are operated such that respective free end portions thereof are moved toward each other, respective free end portions of the pair of arms are moved away from each other because of elastic deformation of the pair of easily deformable portions, so that the respective engaging claws of the pair of arms are disengaged from the first engaging portion.

11. An electric-component holding head, comprising:
    a holder member including a nozzle-hold portion which holds a suction nozzle, and having a negative-pressure passage through which a negative pressure is supplied to the suction nozzle so that the suction nozzle holds an electric component by applying the negative pressure thereto;
    a filter which is provided in the negative-pressure passage and removes foreign matters present in an air passing through the filter;
    the holder member having an outer surface and a filter-insert hole which has an opening in the outer surface and communicates between the outer surface and the negative-pressure passage so that the filter is inserted from outside the holder member via the filter-insert hole into the negative-pressure passage; and a closure member which closes the opening of the filter-insert hole, wherein the closure member includes (a) a closure portion which closes the opening of the filter-insert hole, and (b) a filter-hold portion which holds the filter, wherein the filter-hold portion of the closure member includes (a) a shank portion which extends perpendicularly from the closure portion, and (b) a head portion which is formed at a free end of the shank portion, and wherein the shank portion extends through the filter and the head portion prevents the filter from falling off the shank portion.

12. An electric-component holding head, comprising:

a holder member including a nozzle-hold portion which holds a suction nozzle, and having a negative-pressure passage through which a negative pressure is supplied to the suction nozzle so that the suction nozzle holds an electric component by applying the negative pressure thereto;

a filter which is provided in the negative-pressure passage and removes foreign matters present in an air passing through the filter;

the holder member having an outer surface and a filter-insert hole which has an opening in the outer surface and communicates between the outer surface and the negative-pressure passage so that the filter is inserted from outside the holder member via the filter-insert hole into the negative-pressure passage;

a closure member which closes the opening of the filter-insert hole;

an attaching device which attaches the closure member to the holder member such that the closure member is pivotable relative to the holder member;

a closure-state keeping device which keeps a state in which the closure member closes the opening of the filter-insert hole; and a filter-hold member which is separate from the closure member and holds the filter.

13. An electric-component holding head, comprising:

a holder member including a nozzle-hold portion which holds a suction nozzle, and having a negative-pressure passage through which a negative pressure is supplied to the suction nozzle so that the suction nozzle holds an electric component by applying the negative pressure thereto;

a filter which is provided in the negative-pressure passage and removes foreign matters present in an air passing through the filter;

the holder member having an outer surface and a filter-insert hole which has an opening in the outer surface and communicates between the outer surface and the negative-pressure passage so that the filter is inserted from outside the holder member via the filter-insert hole into the negative-pressure passage;

a closure member which closes the opening of the filter-insert hole;

an attaching device which attaches the closure member to the holder member such that the closure member is pivotable relative to the holder member; and a closure-state keeping device which keeps a state in which the closure member closes the opening of the filter-insert hole;

wherein the closure-state keeping device includes (a) a first engaging portion which is provided by a free end portion of the closure member, and (b) a second engaging portion which is provided by a portion of the holder member and engages the first engaging portion.

14. An electric-component mounting apparatus, comprising:

a movable member; and at least one electric-component holding head which is supported by the movable member and is moved with the movable member to a component-suck position where the holding head receives an electric component from an electric-component supplying device and to a component-mount position where the holding head mounts the electric component on a printed wiring board, the holding head comprising:

a holder member including a nozzle-hold portion which holds a suction nozzle, and having a negative-pressure passage through which a negative pressure is supplied to the suction nozzle so that the suction nozzle holds the electric component by applying the negative pressure thereto;

a filter which is provided in the negative-pressure passage and removes foreign matters present in an air passing through the filter; and at least a portion of the holder member is formed of a substantially transparent material so that the filter is visible from outside the holder member.

15. An electric-component mounting apparatus according to claim 14, wherein the nozzle-hold portion of the holder member holds a plurality of suction nozzles, and the negative-pressure passage of the holder member comprises a common negative-pressure passage which commonly communicates with the plurality of suction nozzles and through which a negative pressure is supplied to each one of the suction nozzles so that said one suction nozzle holds an electric component by applying the negative pressure thereto, and wherein the filter is provided in the common negative-pressure passage.

16. An electric-component holding head, comprising:

a holder member including a nozzle-hold portion which holds a suction nozzle, and having a negative-pressure passage through which a negative pressure is supplied to the suction nozzle so that the suction nozzle holds an electric component by applying the negative pressure thereto;

a filter which is provided in the negative-pressure passage and removes foreign matters present in an air passing through the filter;

the holder member having a flat outer surface apart from the negative-pressure passage, and a filter-insert hole which has an opening in the flat outer surface and communicates between the flat outer surface and the negative-pressure passage so that the filter is inserted from outside the holder member via the filter-insert hole into the negative-pressure passage;

a closure member which closes the opening of the filter-insert hole;

an attaching device which attaches the closure member to the holder member such that the closure member is pivotable, relative to the holder member about an axis line parallel to the flat outer surface of the holder member, to a first position where the closure member closes the opening of the filter-insert hole and a second position where the closure member opens the opening of the filter-insert hole; and a keeping device which keeps the closure member at the first position so that the closure member closes the opening of the filter-insert hole.

17. An electric-component holding head according to claim 16, wherein the nozzle-hold portion of the holder member holds a plurality of suction nozzles, and the negative-pressure passage of the holder member comprises a common negative-pressure passage which commonly communicates with the plurality of suction nozzles and through which a negative pressure is supplied to each one of the suction nozzles so that said one suction nozzle holds an electric component by applying the negative pressure thereto, and wherein the filter is provided in the common negative-pressure passage.

18. An electric-component holding head, comprising:

a holder member including a nozzle-hold portion which holds a suction nozzle, and having a negative-pressure passage through which a negative pressure is supplied to the suction nozzle so that the suction nozzle holds an electric component by applying the negative pressure thereto;

a filter which is provided in the negative-pressure passage and removes foreign matters present in an air passing through the filter;

the holder member having an outer surface and a filter-insert hole which has an opening in the outer surface and communicates between the outer surface and the negative-pressure passage so that the filter is inserted from outside the holder member via the filter-insert hole into the negative-pressure passage;

a closure member which closes the opening of the filter-insert hole; and a filter-hold member which holds the filter, which is separate from the holder member and the closure member, and which is insertable into, and removable from, the negative-pressure passage through the filter-insert hole.

19. A head according to claim 18, wherein at least one of the closure member and the filter-hold member is formed of a substantially transparent material so that in a state in which the closure member closes the opening of the filter-insert hole, the filter is visible from outside the holder member through the closure member and the filter-hold member.

20. An electric-component holding head according to claim 18, wherein the nozzle-hold portion of the holder member holds a plurality of suction nozzles, and the negative-pressure passage of the holder member comprises a common negative-pressure passage which commonly communicates with the plurality of suction nozzles and through which a negative pressure is supplied to each one of the suction nozzles so that said one suction nozzle holds an electric component by applying the negative pressure thereto, and wherein the filter is provided in the common negative-pressure passage.

21. An electric-component holding head, comprising:

a holder member including a nozzle-hold portion which holds a suction nozzle, and having a negative-pressure passage through which a negative pressure is supplied to the suction nozzle so that the suction nozzle holds an electric component by applying the negative pressure thereto;

a filter which is provided in the negative-pressure passage and removes foreign matters present in an air passing through the filter;

the holder member having an outer surface and a filter-insert hole which has an opening in the outer surface and communicates between the outer surface and the negative-pressure passage so that the filter is inserted from outside the holder member via the filter-insert hole into the negative-pressure passage;

a closure member which closes the opening of the filter-insert hole; and a filter-hold member which holds the filter, which is separate from the holder member, and which is insertable with the filter into, and removable with the filter from, the negative-pressure passage through the filter-insert hole.

22. A head according to claim 21, wherein the closure member and the filter-hold member are integral with each other, and are insertable with the filter into, and removable with the filter from, the negative-pressure passage and the filter-insert hole, respectively.

23. A head according to claim 21, wherein at least one of the closure member and the filter-hold member is formed of a substantially transparent material so that in a state in which the closure member closes the opening of the filter-insert hole, the filter is visible from outside the holder member through the closure member and the filter-hold member.

24. An electric-component holding head according to claim 21, wherein the nozzle-hold portion of the holder member holds a plurality of suction nozzles, and the negative-pressure passage of the holder member comprises a common negative-pressure passage which commonly communicates with the plurality of suction nozzles and through which a negative pressure is supplied to each one of the suction nozzles so that said one suction nozzle holds an electric component by applying the negative pressure thereto, and wherein the filter is provided in the common negative-pressure passage.

* * * * *